United States Patent [19]

Mabuchi et al.

[11] Patent Number: 5,645,644
[45] Date of Patent: Jul. 8, 1997

[54] PLASMA PROCESSING APPARATUS

[75] Inventors: Hiroshi Mabuchi; Takahiro Yoshiki, both of Amagasaki; Kyoichi Komachi, Kobe; Tadashi Miyamura, Amagasaki, all of Japan

[73] Assignee: Sumitomo Metal Industries, Ltd., Osaka, Japan

[21] Appl. No.: 546,342

[22] Filed: Oct. 20, 1995

[51] Int. Cl.$^6$ ................................ C23C 16/00
[52] U.S. Cl. .................. 118/723 MW; 118/723 ME; 204/298.38
[58] Field of Search .................... 118/723 MW, 118/723 ME, 723 MA, 723 MR, 723 MP; 156/345; 204/298.38

[56] References Cited

U.S. PATENT DOCUMENTS

| 4,202,095 | 5/1980 | Houchin et al. ................ 422/186 |
| 4,493,254 | 1/1985 | Fjujimura et al. ............... 156/643 |
| 4,987,284 | 1/1991 | Fujimura et al. ............. 219/121.43 |
| 5,124,014 | 6/1992 | Foo et al. .................... 204/192.32 |
| 5,342,472 | 8/1994 | Imahashi et al. .................. 156/345 |
| 5,364,519 | 11/1994 | Fujimura et al. .............. 204/298.38 |
| 5,415,719 | 5/1995 | Atimoto et al. ................... 156/345 |
| 5,433,787 | 7/1995 | Suzuki et al. ................ 118/723 MP |

FOREIGN PATENT DOCUMENTS

| 645835 | 11/1995 | European Pat. Off. . |
| 62-5600 | 4/1987 | Japan . |
| 62-99481 | 11/1987 | Japan . |
| 63-262466 | 1/1988 | Japan . |
| 63-274770 | 6/1988 | Japan . |
| 2-177326 | 2/1990 | Japan . |
| 3-94422 | 1/1991 | Japan . |
| 862436 | 2/1961 | United Kingdom . |
| 2131600 | 3/1984 | United Kingdom . |

OTHER PUBLICATIONS

Komachi, "Affecting Factors on Surface-Wave-Produced Plasma," Journal of Vacuum Science and Technology, Part A, vol. 11, No. 1, Jan. 1993, pp. 164–167.

*Primary Examiner*—R. Bruce Breneman
*Assistant Examiner*—Joni Y. Chang
*Attorney, Agent, or Firm*—Lane, Aitken & McCann

[57] ABSTRACT

A plasma processing apparatus comprises means of supplying the microwave, a reaction chamber having a microwave lead-in opening, a microwave window for introducing the microwave provided by the microwave supply means into the reaction chamber through the microwave lead-in opening, and a supporting member having beams for supporting the microwave window. The apparatus has its microwave window divided in correspondence to areas of the supporting member divided by the beams. The apparatus can have a larger microwave window which is reinforced by the beams against the pressure at plasma generation, and is capable of processing large semiconductor substrates and glass substrates for liquid crystal display panels stably and uniformly.

7 Claims, 12 Drawing Sheets

PLASMA PROCESSING APPARATUS

BACKGROUND OF THE INVENTION

1. Field of the Invention

The present invention relates to a plasma processing apparatus used suitably for the etching, ashing and CVD processes in manufacturing large scale integration (LSI) circuits and liquid crystal display (LCD) panels.

2. Description of the Related Art

Plasma generated by the radio frequency (RF) wave or microwave is used widely in the manufacturing process of LSI and LCD devices. Particularly, dry etching based on plasma is indispensable for the manufacturing process of LSI and LCD devices.

RF plasma has been used more often than microwave plasma because of the difficulty of the generation of uniform microwave plasma over a large area in exchange for its advantage of obtaining low-temperature and high-density plasma. The uniformity of plasma is an influential factor for the uniform etching, ashing and CVD processes.

As a plasma processing apparatus capable of producing uniform microwave plasma over a large area, the applicant of the present invention has proposed a plasma processing apparatus having a dielectric sheet, as disclosed in Japanese Patent Application Laid-Open No. 62-5600 and No. 6299481.

FIG. 1A is a schematic plan view of this plasma processing apparatus having a dielectric sheet, and FIG. 1B shows the longitudinal cross section along the line A—A of FIG. 1A. In this plasma processing apparatus, the microwave generated by a microwave generator 24 is directed by a waveguide 23 into a dielectric sheet 21. The microwave propagated in the dielectric sheet 21 forms an electric field in a space 20 beneath it. This electric field penetrates a microwave window 4 and enters a reaction chamber 1 through a microwave lead-in opening 3. The electric field excites gas in the reaction chamber 1, and plasma is generated. By the generated plasma, the surface of a sample S is processed.

The dielectric sheet 21 is made of fluorcarbon polymer such as Teflon (registered trademark). The microwave window 4 is made of a material having a high thermal durability, microwave transmissibility and small dielectric loss, e.g., quartz or ceramics (SiN, $Al_2O_3$, etc.).

The dielectric sheet 21 consists of an entry section 211, a fan-out section 212 and a flat section 213. The microwave led by the waveguide 23 enters the dielectric sheet 21 at the entry section 211, expands in the transverse direction in the fan-out section 212, and proceeds to the flat section 213. Based on this structure, the microwave can be propagated with a uniform transverse distribution in the large flat section 213.

With this dielectric sheet provided, the plasma processing apparatus can readily generate plasma over a large area by having a large flat section 213 of the dielectric sheet 21, a large microwave window 4 and a large microwave lead-in opening 3. Plasma processing apparatus, including the one with the dielectric sheet mentioned above, which generate large and uniform plasma beneath a large microwave window have a superior ability of plasma processing based on the resulting high-density and highly active plasma near the microwave window.

In recent years, large glass substrates are used for liquid crystal display panels, and there are intense demands for apparatus that are capable of uniformly processing glass substrates of 400-by-400 mm or larger. Plasma processing apparatus mentioned above attain the uniformity of plasma by using large microwave windows, and the apparatus need to have much larger microwave windows to meet the sizes of substrates to be processed.

However, plasma is generated in the reaction chamber under reduced pressure, and therefore the microwave window must be durable against the differential pressure between the interior and exterior of the reaction chamber. A larger microwave window needs to be thicker.

A thicker microwave window has a greater difference of temperature between the inner side of the reaction chamber which is heated by plasma and the outer side, and there arises the problem of the breakage of window due to the thermal strain. Moreover, a thicker microwave window is heavier and therefore difficult to handle. Microwave windows made of quartz or alumina are expensive, and therefore a microwave window having an increased thickness will be more costly.

It is difficult to manufacture uniformly a large sheet of quartz or alumina used for the microwave window, and therefore a too large microwave window is subjected to uneven dielectric heating and is more prone to break due to the thermal strain.

SUMMARY OF THE INVENTION

The present invention is intended to solve the foregoing problems, and its prime object is to provide a plasma processing apparatus that does not need a thick microwave window even though it has a large window.

The plasma processing apparatus based on this invention is characterized in the provision of beams which support the microwave window and reinforce it against the pressure. Accordingly, even a large microwave window can be thinner than the thickness that would be required inherently to cope with the pressure. Consequently, the fear of breakage due to the thermal strain can be alleviated. Owing to the avoidance of a thicker microwave window, handling is retained easy and the manufacturing cost of the apparatus is prevented from rising.

The microwave window is actually supported by a unitary window supporting member made up of the beams and their outer frame which matches in shape with the microwave lead-in opening. The window supporting member may be formed together with the reaction chamber as a unitary member.

The plasma processing apparatus based on this invention is further characterized in its microwave window which is divided in correspondence to areas of the supporting member divided by the beams. Since each small divided microwave window is more durable against the pressure than the microwave window of the whole area, the fear of breakage due to the thermal strain can further be alleviated. Moreover, small uniform plates can be used for the small divided microwave windows, and the problem associated with the uneven dielectric heating of a large microwave window is solved.

The number of division of the microwave window may not be equal to the number of areas divided by the beams. For example, in case the whole area is divided into four areas by the beams, the microwave window may be divided into two or divided into three.

On the other hand, the use of beams imposes the following problems. Beams are made of a metallic material such as stainless steel as a base material for providing a sufficient strength, and therefore no plasma is generated beneath the beams. A sample placed under the beams is subjected to the distribution of plasma, which reflects the shape of the beam structure. Accordingly, in order to render the uniform plasma processing to the sample, it must be spaced out from the beams by a distance enough for plasma to spread by diffusion. However, the density of ions and reactive species and their activity at a position in the reaction chamber decrease as its distance from the microwave window increases, and therefore an excessive distance of the sample from the beams will impose another problem of slower plasma processing rate.

Another object of the present invention is to provide a plasma processing apparatus capable of minimizing the difference of plasma generation between positions near the beams and other positions and improving the uniformity of the plasma near the beams so that the whole sample is exposed to uniform and highly active plasma.

The plasma processing apparatus based on this invention is characterized in the gas supply to the reaction chamber from the window supporting beams. The gas is supplied into the reaction chamber from the beams where plasma generation is inherently inactive, so that the quantity of plasma generation in the neighborhood of the beams is increased by the high-density gas. Consequently, plasma spreads uniformly at positions with short distances from the beams owing to the enhancement of plasma generation beneath the beams. In addition, a sufficient supply of gas from the beams to the central portion of the reaction chamber creates a uniform gas distribution even in the case of a large reaction chamber.

A enlarged microwave window that is made possible by the inventive beam structure is particularly useful when it is applied to a plasma processing apparatus having a dielectric sheet. In this plasma processing apparatus, in which the microwave is propagated in the dielectric sheet, it is possible even for a large flat section of the dielectric sheet disposed in parallel to a microwave window to propagate the microwave uniformly. Consequently, it is possible even for a large microwave window to transmit the microwave uniformly into the reaction chamber. Accordingly, the advantage of the enlarged microwave window based on the beam structure is particularly vitalized for a plasma processing apparatus having a dielectric sheet.

In a plasma processing apparatus having a dielectric sheet, the dielectric sheet is disposed in parallel to the microwave window. The microwave is propagated mainly in the dielectric sheet, and the electric field leaked out of the dielectric sheet is supplied perpendicularly to the microwave propagation direction to the reaction chamber through the microwave window. Accordingly, the strength of electric field is small in the neighborhood of the microwave window as compared with the case of introducing the microwave directly into the reaction chamber through a microwave window from a waveguide. On this account, the provision of the beams ( metal ) in the vicinity to the microwave window involves little influence of the microwave reflection.

Still another object of the present invention is to provide a plasma processing apparatus having a dielectric sheet capable of rendering the exposure of highly active plasma to a sample.

The plasma processing apparatus based on this invention is characterized in its window supporting beam structure as follows. Slit openings are formed by beams of the window supporting member. The slit openings have their shorter side dimensioned greater than or equal to 1/6 of the wavelength of the microwave and smaller than or equal to the microwave wavelength, and are arranged at a spacing smaller than or equal to the microwave wavelength. The slit openings having the above-mentioned dimension enable the microwave to pass through and generate plasma.

The arrangement of these slit openings at the above-mentioned spacing results in the dispersion of the beams which creates a shadow against the microwave and also the enhancement of the electric field in each slit opening. The arrangement of the slit openings at a spacing smaller than or equal to the microwave wavelength also enables the utilization of the diffraction of microwave. Consequently, the pattern of unevenness of the electric field distribution in the reaction chamber can be made finer, and plasma becomes to be uniform by diffusion in a short distance from the window supporting member.

These and other features and advantages of the invention will be better understood from the following detailed description taken in conjunction with the accompanying drawings.

DETAILED DESCRIPTION

The present invention will be explained for its specific embodiments with reference to the drawings.

Embodiment 1

Figure 1A:
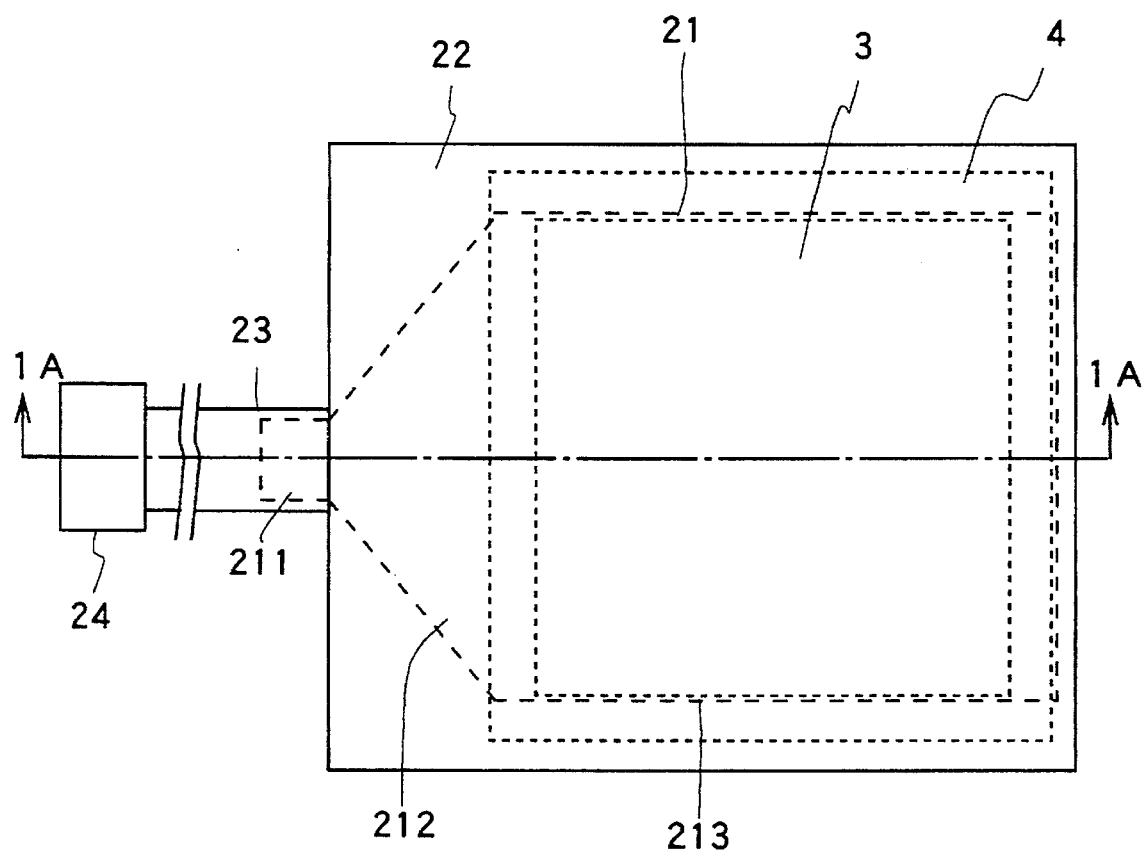
FIG. 1A is a schematic plan view of a plasma processing apparatus having a dielectric sheet.
Figure 1B:
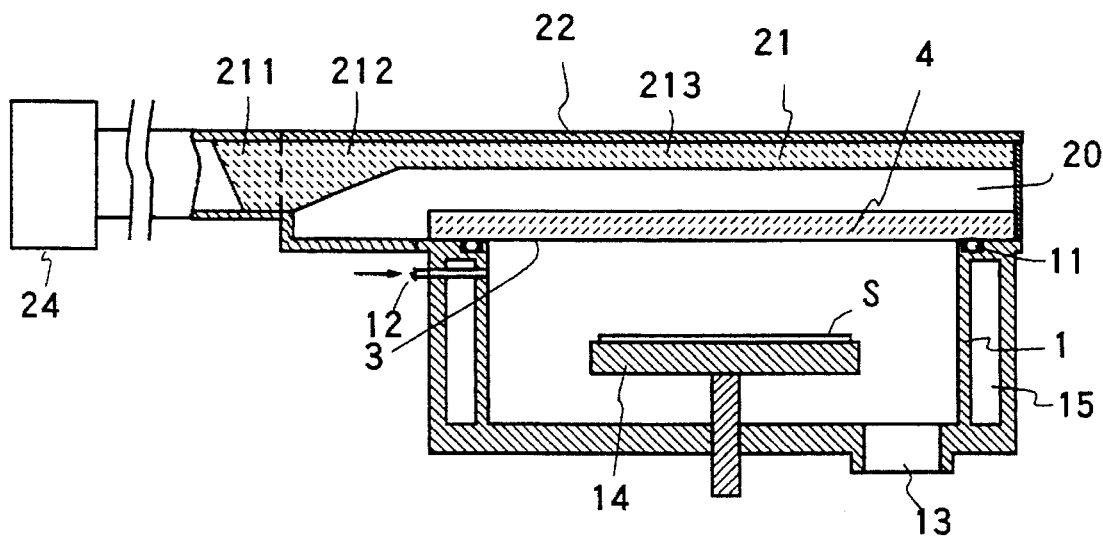
FIG. 1B is a longitudinal cross-sectional diagram taken along the line A—A of FIG. 1A.
Figure 2A:
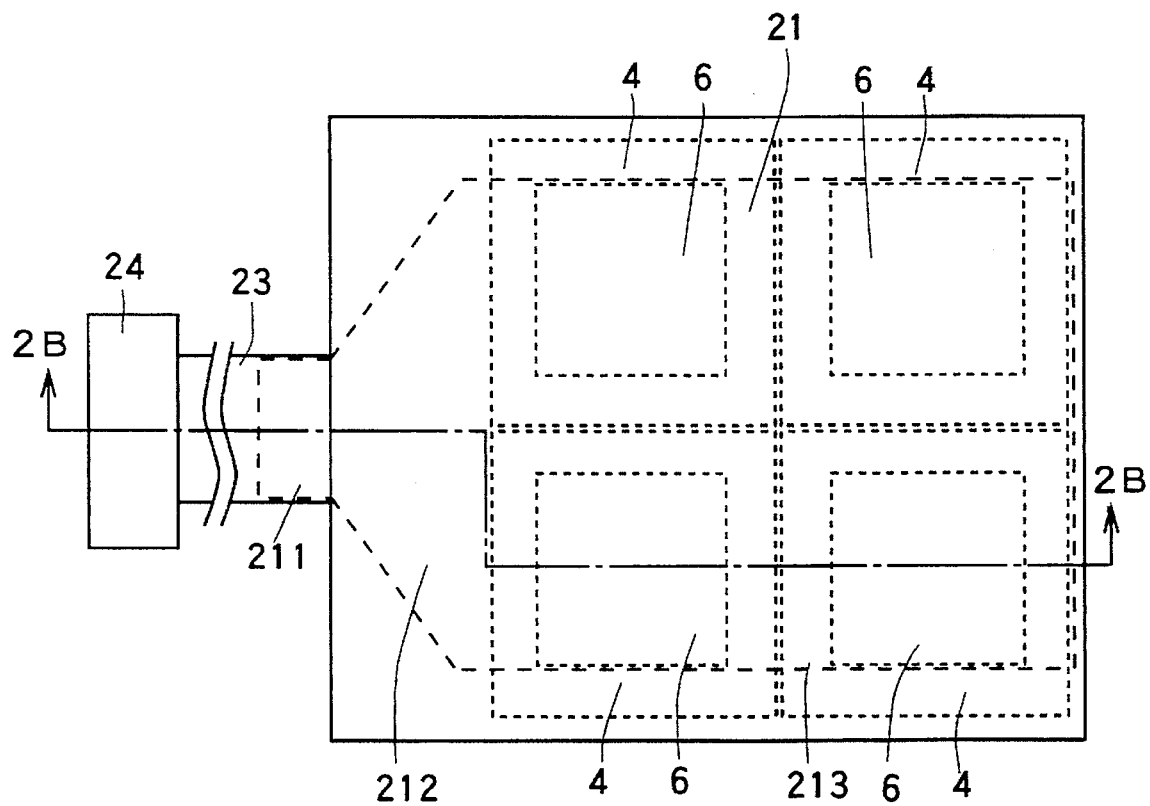
FIG. 2A is a schematic plan view of the plasma processing apparatus based on a first embodiment of this invention.
Figure 2B:
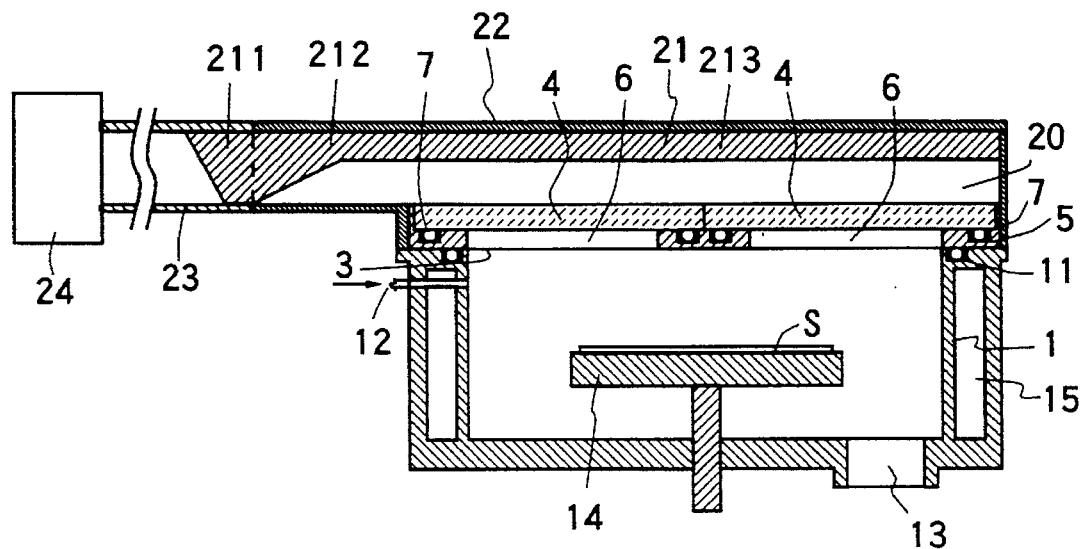
FIG. 2B is a longitudinal cross-sectional diagram taken along the line B—B of FIG. 2A.

FIG. 2A is a schematic plan view of the plasma processing apparatus based on the first embodiment of this invention, and FIG. 2B shows the longitudinal cross section along the line B—B of FIG. 2A. The apparatus of this embodiment is provided with a window supporting member 5 made up of crossing beams and their outer frame. The beams and outer frame define four openings (2-by-2 in the microwave propagation direction and dielectric sheet transverse direction). The microwave window is divided into four in correspondence to the four openings, and the divided microwave windows are disposed to cover the respective openings.

A reaction chamber 1 having a shape of rectangular box is made of metal such as aluminum or stainless steel. The reaction chamber 1 has dual walls, with the space between the walls forming a passage 15 of cooling water. A stage 14 for a sample S is placed inside the reaction chamber 1. Two gas inlets 12 are provided on each side of the walls of the reaction chamber 1, and an evacuation port 13 which communicates with an evacuation pump is formed in the bottom of the reaction chamber 1.

The reaction chamber 1 has a microwave lead-in opening 3 at the top. The window supporting member 5 is placed atop the placed atop the walls of the reaction chamber 1, with an 0-ring 11 being interposed. The microwave windows 4 are placed on the window supporting member 5, with 0-rings 7 being interposed. Accordingly, the reaction chamber 1 is airtight when it is evacuated. The microwave windows 4 are made of a material having high microwave transmissibility, small dielectric loss and high thermal durability, e.g., quartz or ceramics (SIN, $Al_2O_3$, etc.).

Disposed over the reaction chamber 1 to confront the microwave windows 4 are a dielectric sheet 21 and metallic plate 22. The dielectric sheet 21 is made of a dielectric material having a small dielectric loss, such as fluorocarbon polymer, polystyrene or polyethylene, and the metallic plate 22 is made of aluminum or the like.

The dielectric sheet 21 is connected by a waveguide 23 to a microwave generator 24. The microwave generated by the microwave generator 24 is directed by the waveguide 23 to the dielectric sheet 21, and it enters the reaction chamber 1 through the microwave windows 4. The dielectric sheet 21 consists of an entry section 211, a fan-out section 212 and a flat section 213. The microwave led by the waveguide 23 enters the dielectric sheet 21 at the entry section 211, expands in the fan-out section 212 in the transverse direction, and proceeds to the flat section 213. Based on this structure, the microwave is propagated with a uniform transverse distribution in the large flat section 213.

Figure 3A:
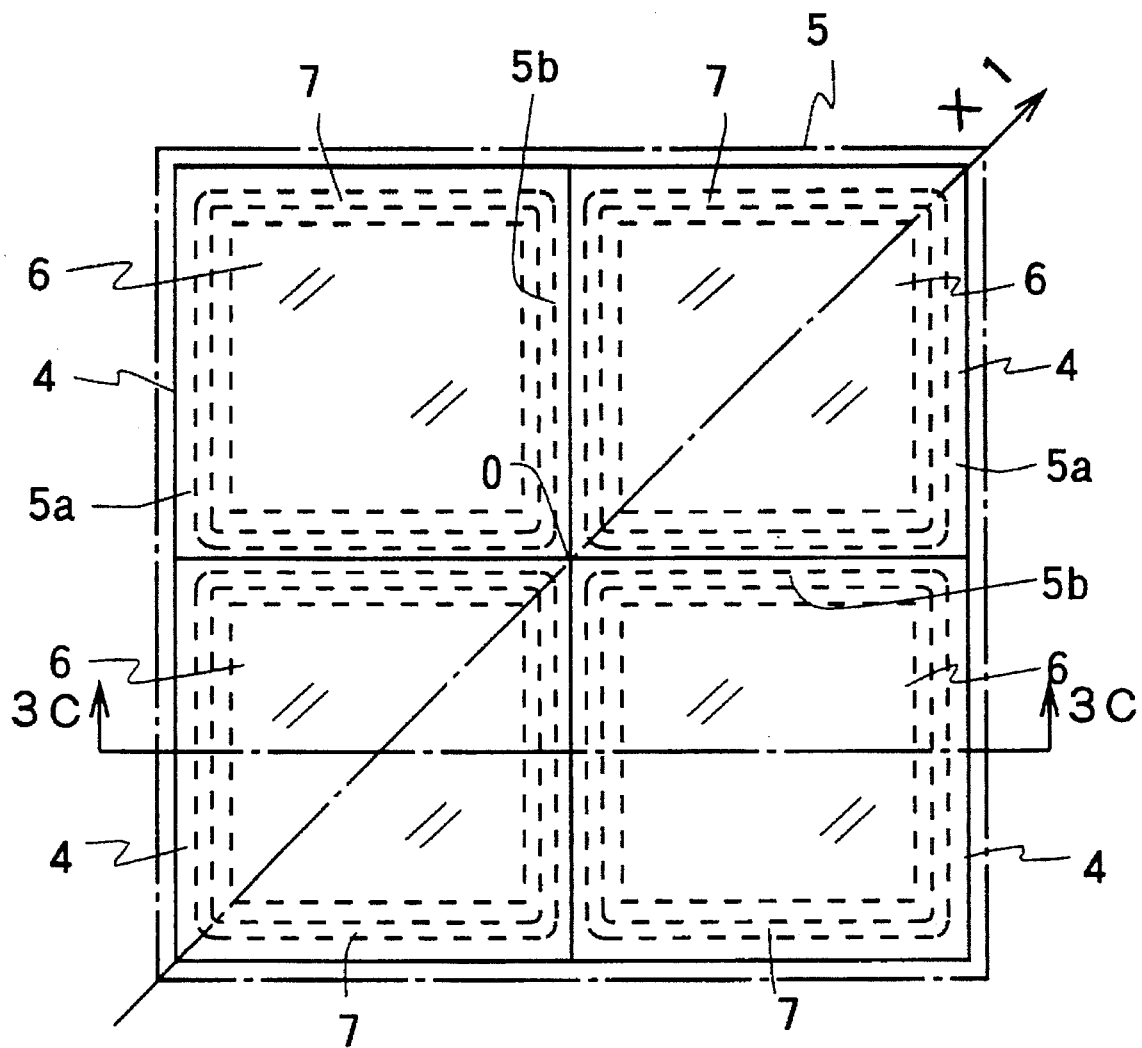
FIG. 3A is a schematic plan view of the window supporting member shown in FIG. 2B.
Figure 3B:
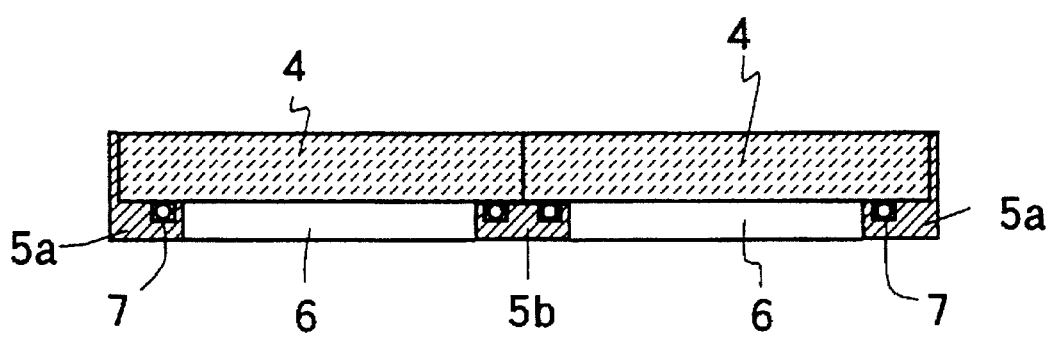
FIG. 3B is a longitudinal cross-sectional diagram taken along the line C—C of FIG. 3A.

FIG. 3A is a schematic plan view of the window supporting member 5 shown in FIG. 3B, and FIG. 3B shows the longitudinal cross section of the member 5 along the line C—C of FIG. 3A, with the microwave windows 4 being placed on it. The window supporting member 5 consists of a square frame 5a which matches in shape with the top of the walls of the reaction chamber 1, and central crossing beams 5b which divide the inner area of the frame 5a into four equal areas. Accordingly, the frame 5a and crossing beams 5b form four openings 6, and the four microwave windows 4 are placed over the respective openings of the window supporting member 5. Four 0-rings which surround the openings 6 are interposed between the microwave windows 4 and window supporting member 5, so that the reaction chamber 1 is airtight when it is evacuated, as mentioned previously. The window supporting member 5 is made of stainless steel as a base material, with part of the surface exposed to plasma being coated with aluminum.

The plasma processing of this apparatus for the sample S will be explained in connection with FIGS. 2A and 2B. Cooling water is supplied to the apparatus so that it circulates the passage 15. The sample S is placed on the stage 14 in the reaction chamber 1. The reaction chamber 1 is evacuated through the evacuation port 13, and thereafter gas is supplied into it through the gas inlets 12 to establish the required pressure. The microwave generator 24 is activated to generate the microwave, and it is directed by the waveguide 23 to the dielectric sheet 21. The microwave propagating in the dielectric sheet goes across the space 20, and introduced into the reaction chamber 1 through the microwave windows 4. The electric field of the microwave generates plasma in the reaction chamber 1, by which the sample S is processed.

For the evaluation of the uniformity of plasma generated by the apparatus of this embodiment, the ion current density distribution was measured. The dimensions and materials of the major parts of the apparatus are as follows. The plasma generation area (area of the microwave lead-in opening 3) is 500-by-500 mm. The window supporting member 5 has a beam width of 80 mm, and has four openings 6 each dimensioned by 210-by-210 mm. Each microwave window 4 has an area of 290-by-290 mm and a thickness of 20 mm, and the material is quartz. The dielectric sheet 21 has its flat section 213 dimensioned by 700 mm in length, 500 mm in width and 20 mm in thickness, and the material is Teflon.

The conditions of plasma generation and measurement of the ion current density distribution are as follows. Argon gas was supplied into the reaction chamber 1 to establish a pressure of 10 mTorr. The microwave of 1 kW (frequency: 2.45 GHz; pulse wave (frequency: 60 Hz)) was supplied to generate plasma. The ion current density was measured at several points aligning on the diagonal X1 (shown in FIG. 3A) at distances of 60 mm (plots □ on the graph of FIG.4), 80 mm (plots △) and 100 mm (plots ○) from the beams of the window supporting member.

A probe of disc electrode of 2.0 nun in diameter made of stainless steel was used to measure the ion current density. With a D.C. voltage of −50 V being applied to the probe against the reaction chamber wall, a current i flowing into the probe from the plasma was measured. The ion current density was calculated by dividing the magnitude of current i by the area of electrode of the probe.

Figure 4:
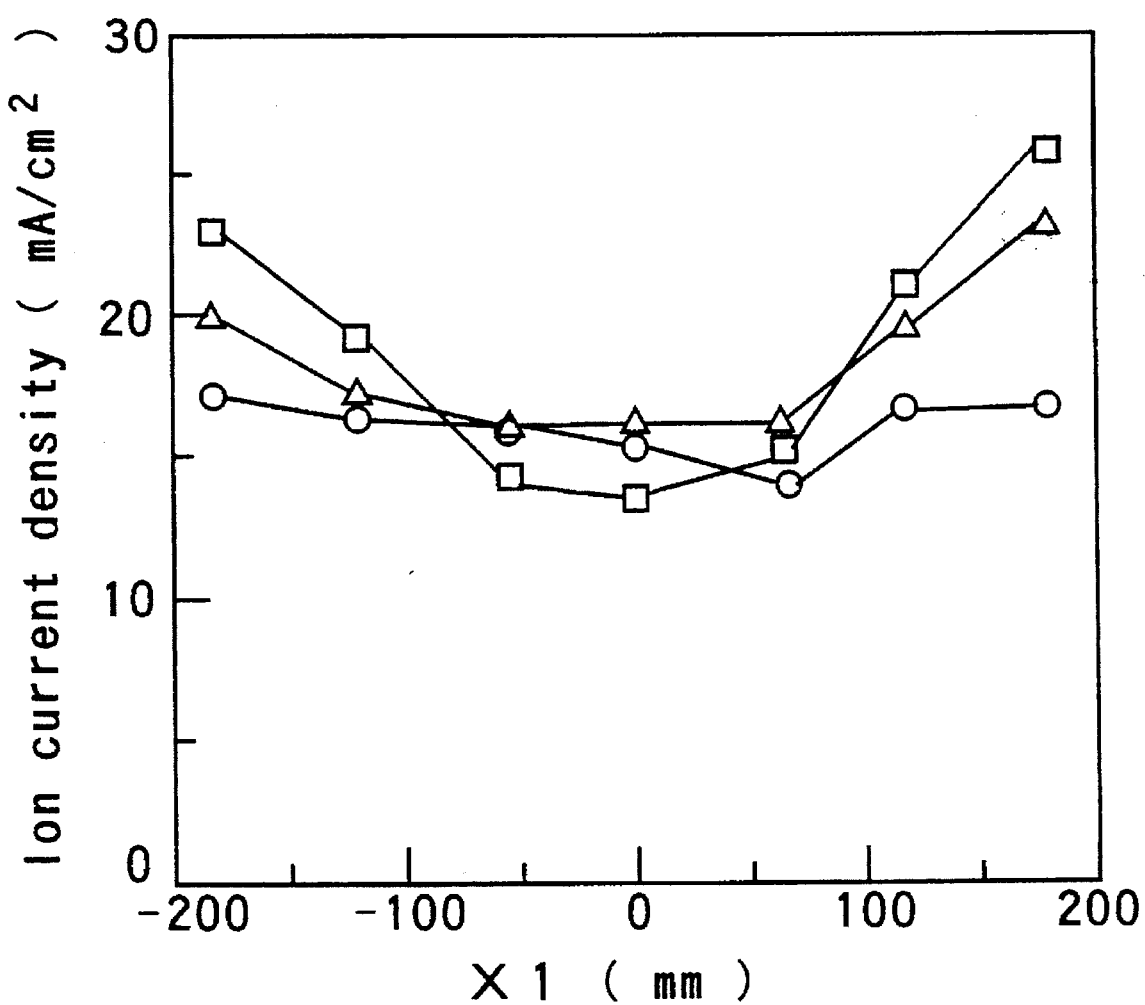
FIG. 4 is a graph showing the ion current density distribution for the plasma processing apparatus of the first embodiment.

FIG. 4 shows the ion current density distribution. At the positions at distances of 60 mm (△) and 80 mm (□) from the beam, in the center region of chamber (the region below the beams of supporting member) the ion current density decreases due to the presence of the beams, and the ion current density is virtually constant at the positions at a distance of 100 mm (○) from the beams. Accordingly, the apparatus of this embodiment attains the uniformity of plasma due to spreading by diffusion at positions that are distant by at least 100 mm from the beams.

At the same time, the apparatus was tested in the above-mentioned operating conditions for the influence of thermal strain on the microwave window by running the apparatus for 25 operation cycles each having a 5-minute plasma generation period and a 1-minute halt period. Such abnormalities as cracks in the window were not observed at all.

Embodiment 2

Figure 5:
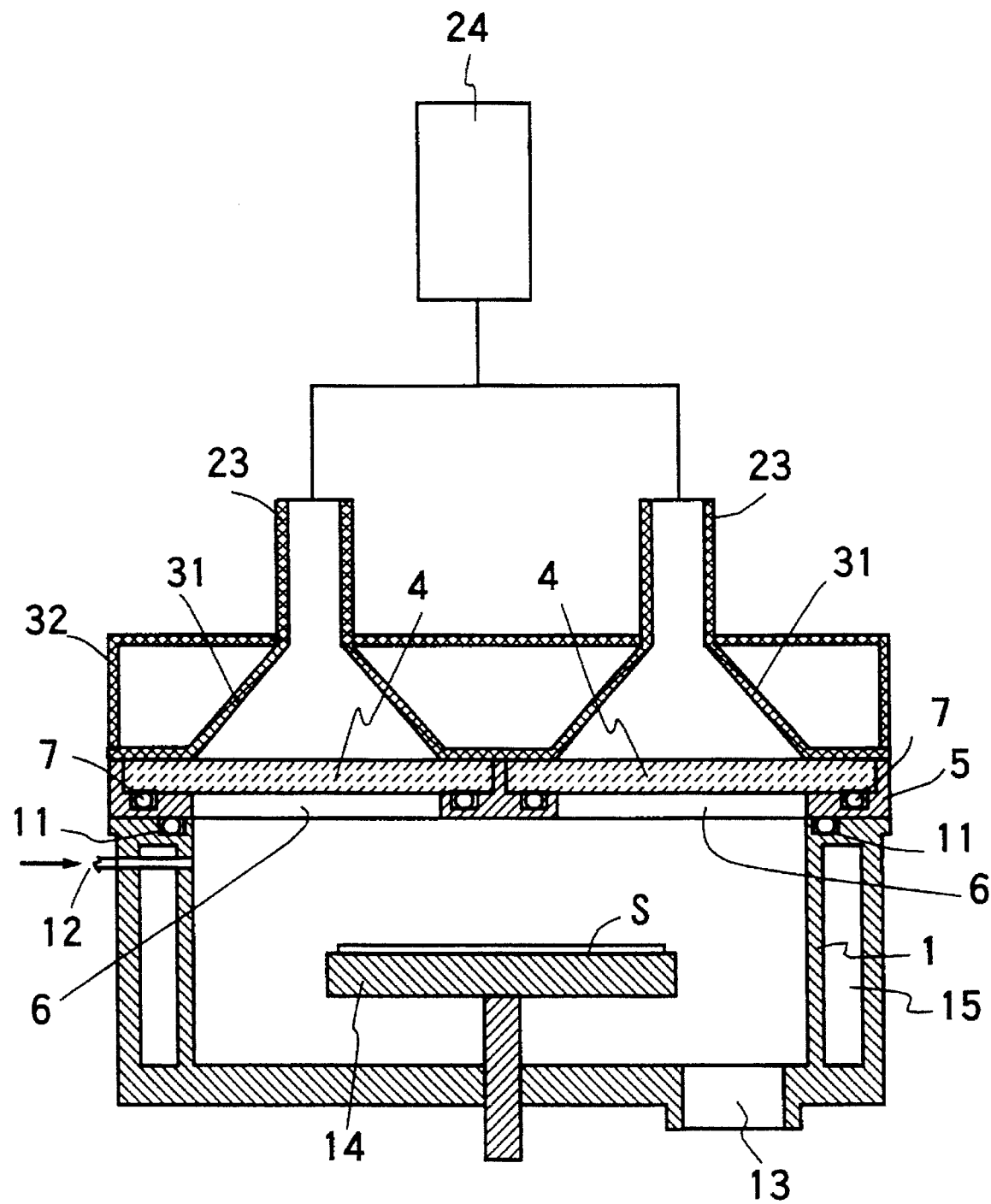
FIG. 5 is a longitudinal cross-sectional diagram of the plasma processing apparatus based on a second embodiment of this invention.

FIG. 5 shows the longitudinal cross section of the plasma processing apparatus based on the second embodiment of this invention. This embodiment is different from the first embodiment in the setup for the intake of microwave. The following explains only the microwave intake section, and explanation of the remaining portion which is identical to the first embodiment will be omitted.

The reaction chamber 1 has atop the walls a window supporting member 5 which has four openings 6 to be covered by microwave windows 4 airtightly, as in the first embodiment. Disposed over the microwave windows 4 are four horns 31, which are connected by associated waveguides 23 to a microwave generator 24 by way of a microwave divider (not shown).

The microwave generated by the microwave generator 24 is led by the microwave divider (not shown) to the four waveguides 23 and then to the horns 31. The microwave which is spread uniformly by each horn 31 passes through the microwave window 4 and enters the reaction chamber 1. A horn cover 32 is provided for alleviating the deformation of the horns 31 and also facilitating their attachment.

Figure 6A:
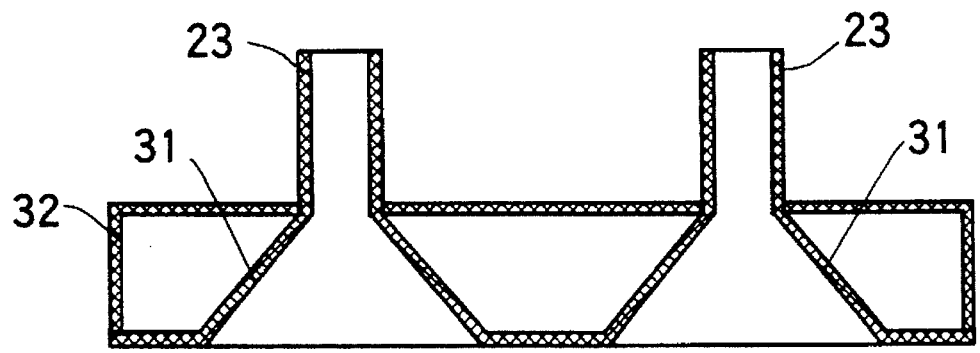
FIG. 6A is a longitudinal cross-sectional diagram of the horn section shown in FIG. 5.
Figure 6B:
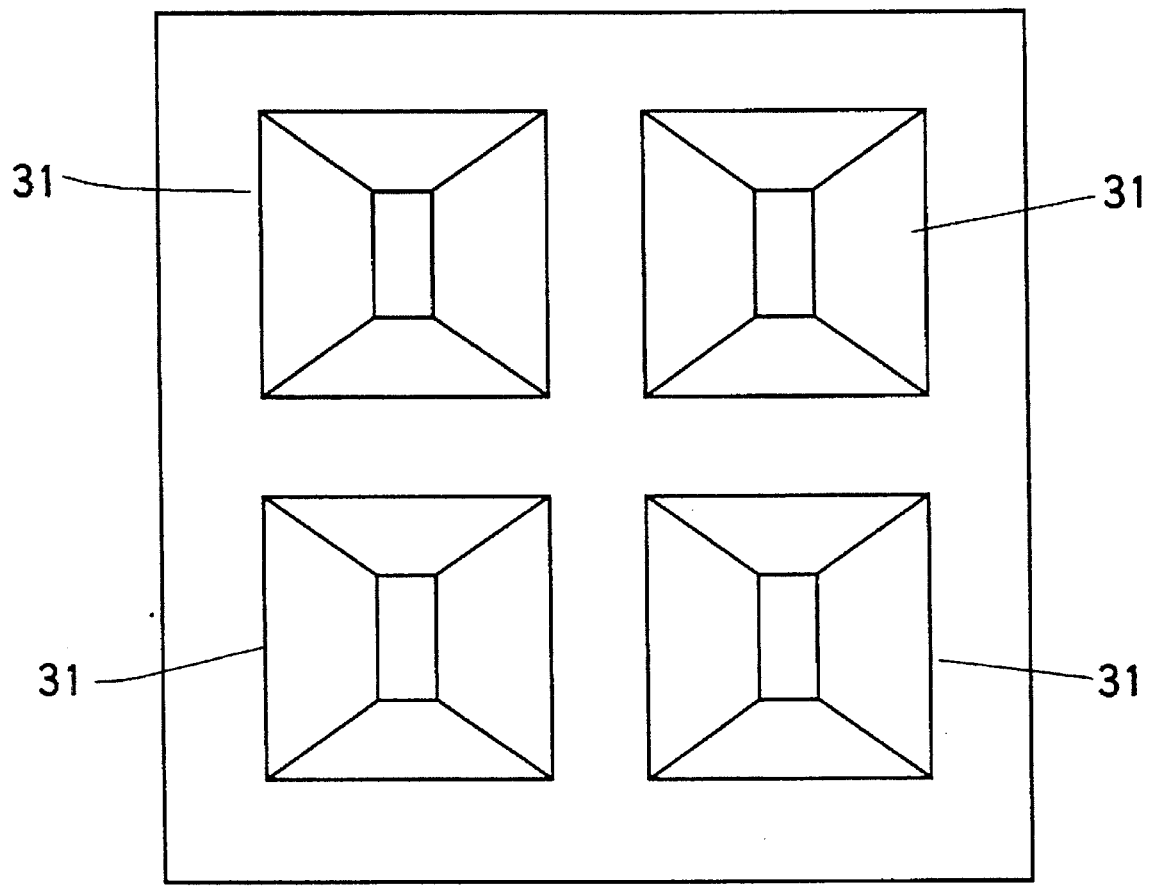
FIG. 6B is a schematic bottom view of the horn section shown in FIG. 5.

FIGS. 6A and 6B show the longitudinal cross section and the bottom view respectively, of the horns 31 and horn cover 32.

The present invention pertains to a microwave processing apparatus having a large microwave window, so this invention is applicable not only to apparatus having dielectric sheets, but also to apparatus employing the microwave intake scheme of this embodiment and to ECR plasma processing apparatus.

Embodiment 3

Figure 7A:
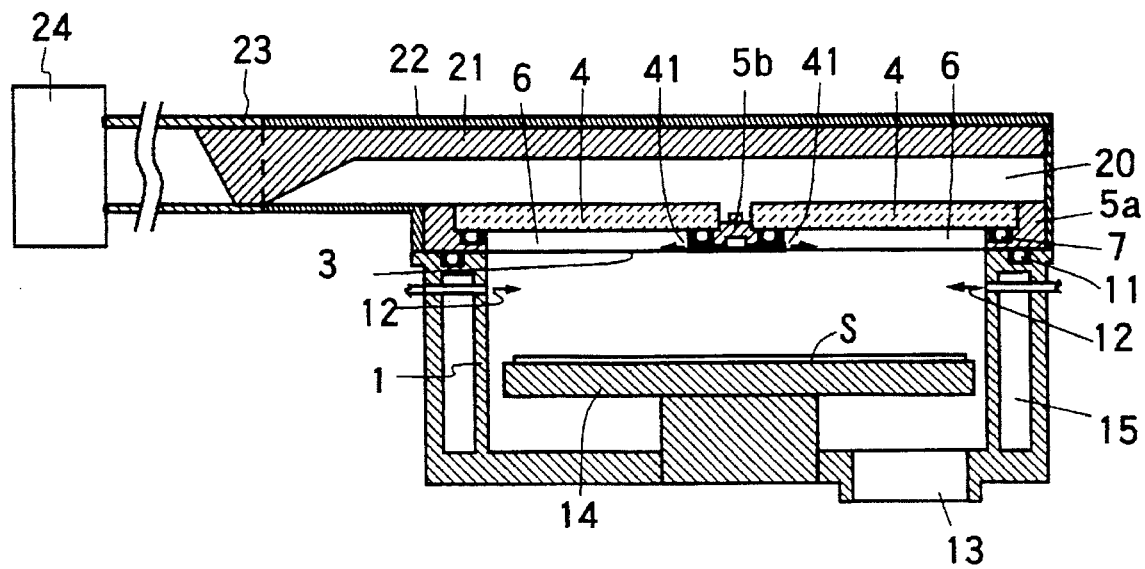
FIG. 7A is a longitudinal cross-sectional diagram of the plasma processing apparatus based on a third embodiment of this invention.
Figure 7B:
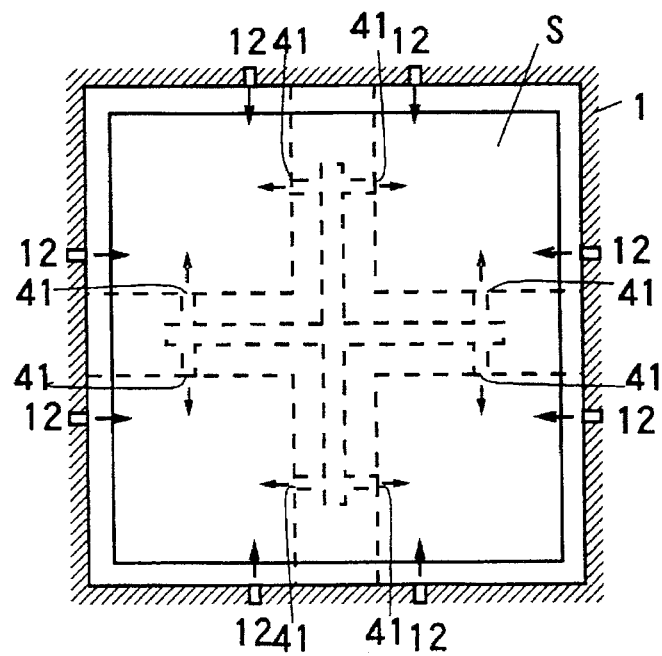
FIG. 7B is a schematic plan view of this plasma processing apparatus, showing the setup for gas supply into the reaction chamber based on the third embodiment.

FIG. 7A shows the longitudinal cross section of the plasma processing apparatus based on the third embodiment of this invention, and FIG. 7B is a schematic plan view showing the setup for the gas supply to the reaction chamber of this apparatus. The apparatus has gas inlets 41 provided in the beams 5b with the intention of improving the uniformity of plasma. The remaining portion is identical to the first embodiment, and explanation thereof will be omitted.

In FIG. 7B, the arrows indicate the direction of gas flow into the chamber. Gas from eight gas inlets 12 opening on the walls of reaction chamber 1 flows toward the sample S placed at the center of the chamber, and gas also flows in from eight gas inlets 41 provided in the beams 5b (shown by the dashed line) toward the periphery of the sample S. This structure increases the gas density around the beams 5b, thereby improving the uniformity of plasma.

Figure 8A:
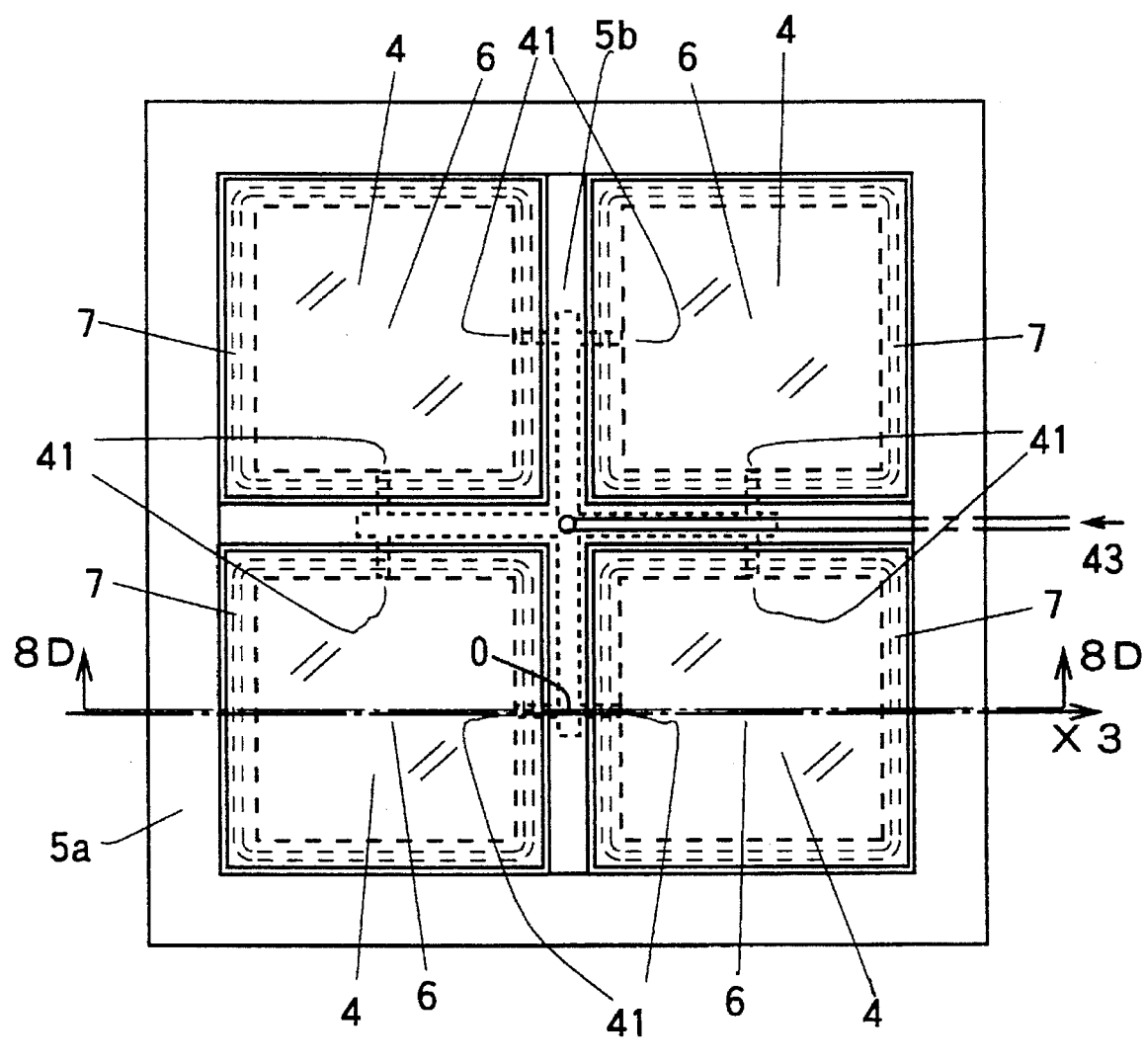
FIG. 8A is a schematic plan view of the window supporting member shown in FIG. 7A.
Figure 8B:
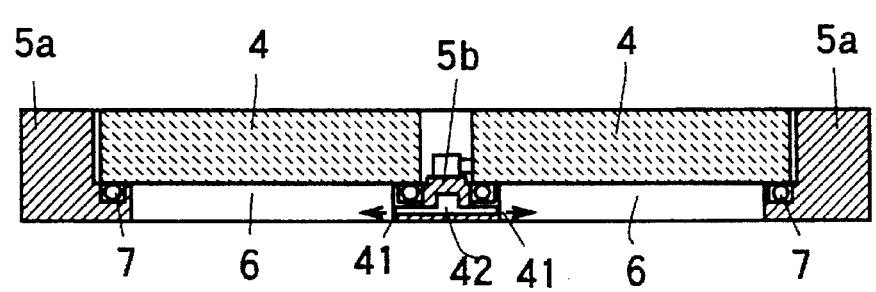
FIG. 8B is a longitudinal cross-sectional diagram taken along the line D—D of FIG. 8A.

FIG. 8A is a schematic plan view of the window supporting member shown in FIG. 7A, and FIG. 8B shows the longitudinal cross section along the line D—D of FIG. 8A. The crossing beams 5b have a internal gas supply passage 42 which communicates with the eight gas inlets 41. Gas which is supplied to the internal gas supply passage 42 at the center of the crossing beams 5b is introduced into the reaction chamber 1 from the eight gas inlets 41.

For the evaluation of the uniformity of plasma, the ion current density distribution was measured. The dimensions and materials of the apparatus are as follows. The plasma generation area (area of the microwave lead-in opening 3) is 600-by-600 mm. The window supporting member 5 has a beam width of 100 mm and has four openings 6 each dimensioned by 250-by-250 mm. Each microwave window 4 has an area of 300-by-300 mm and a thickness of 20 mm, and the material is quartz. The dielectric sheet 21 has its flat section 213 dimensioned by 800-by-600 mm and 20 mm in thickness, and the material is Teflon.

The conditions of plasma generation and measurement of ion current density distribution are as follows. Argon gas of a total amount of 1 slm was supplied into the reaction chamber 1, of which 500 sccm was from the eight gas inlets 12 of the walls and 500 sccm was from the eight gas inlets 41 of the beams 5b, to establish a pressure of 10 mTorr. The microwave of 1 kW (frequency: 2.45 GHz; continuous wave) was supplied to generate plasma.

The ion current density was measured at several points aligning on the line X3 (shown in FIG. 8A) at a distance of 60 mm from the window supporting member. For the comparison, the same measurement was conducted with the setup for the supply of argon gas of a total amount of 1 slm to the reaction chamber 1 only from the eight gas inlets 12 of the walls.

Figure 9:
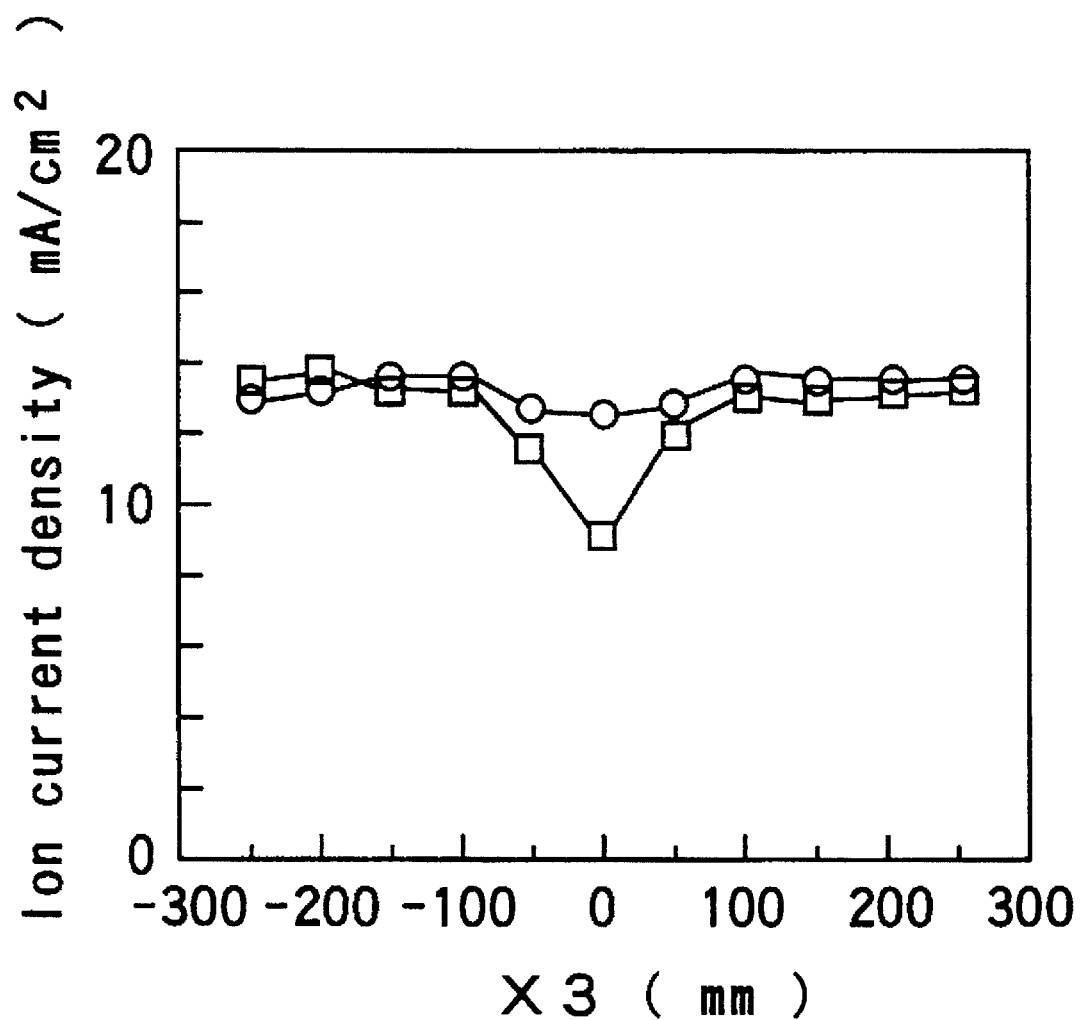
FIG. 9 is a graph showing the ion current density distribution for the plasma processing apparatus of the third embodiment.

FIG. 9 shows the ion current density distribution, in which plotted by mark o is the result of the apparatus of this embodiment and plotted by mark □ is the result of the setup for comparison. The result reveals the achievement of a uniform plasma distribution even at positions as close as 60 mm to the window supporting member based on the setup for the gas supply from the supporting beams in addition to the gas supply from the walls of reaction chamber.

Embodiment 4

Figure 10A:
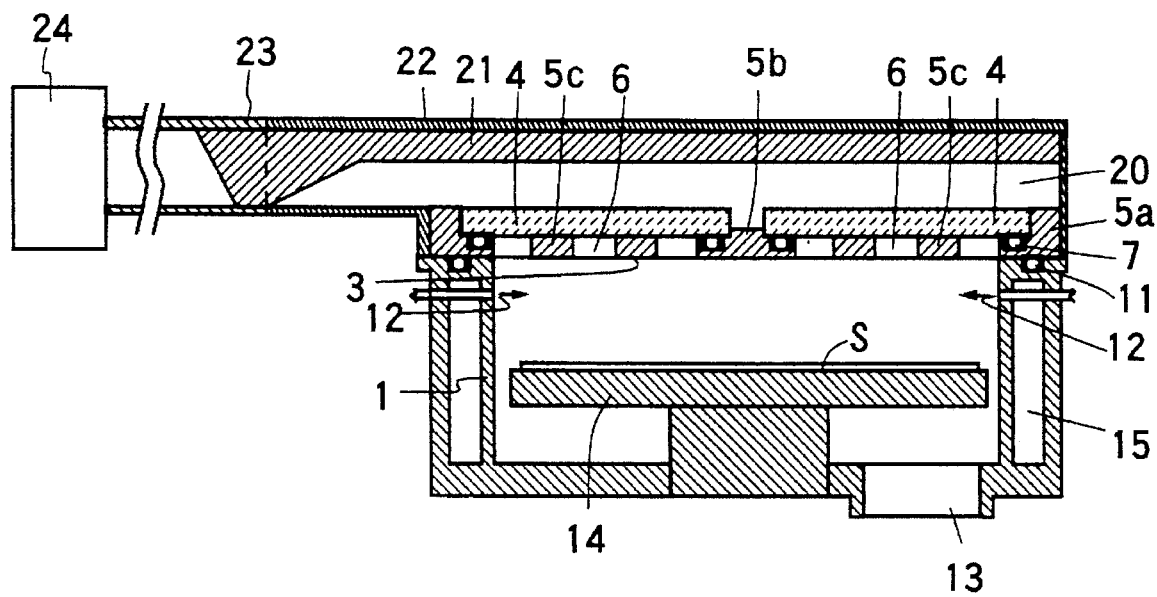
FIG. 10A is a cross-sectional diagram of the plasma processing apparatus based on a fourth embodiment of this invention.
Figure 10B:
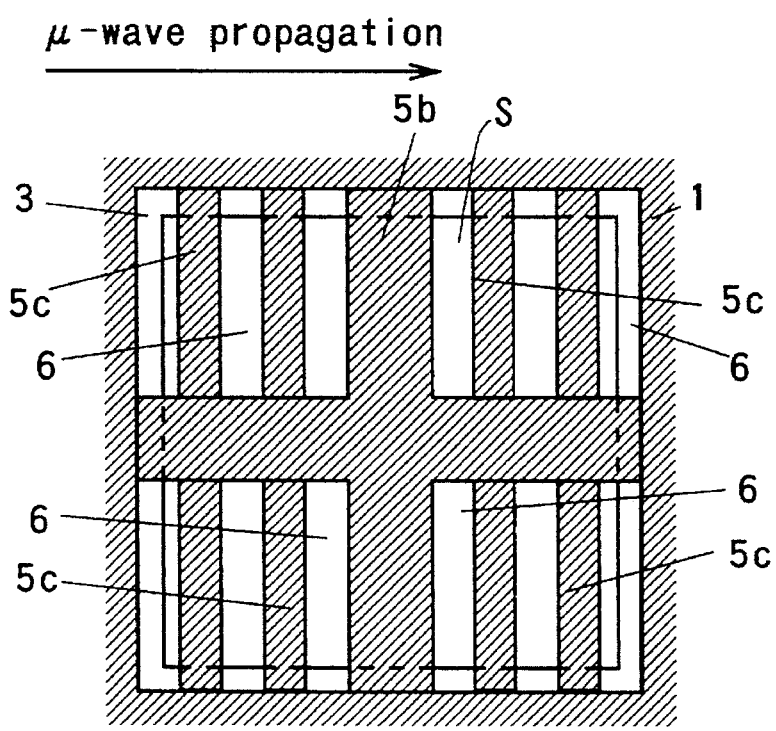
FIG. 10B is a schematic plan view of this plasma processing apparatus, showing the structure for gas feed into the reaction chamber based on the fourth embodiment.

FIG. 10A shows the longitudinal cross section of the plasma processing apparatus based on the fourth embodiment of this invention, and FIG. 10B is a schematic plan view showing the setup for the introduction of microwave to the reaction chamber of this apparatus. In this apparatus, a window supporting member 5 has its openings 6 formed in the shape of slit with the intention of improving the uniformity of plasma. The remaining portion is identical to the first embodiment, and explanation thereof will be omitted.

In FIG. 10B, the hatched portions are the wall of reaction chamber 1 and beams 5b and 5c of window supporting member which create a shadow against the microwave. The rectangular slit openings 6 defined by the beams align in the direction of microwave propagation. This structure makes the pattern of unevenness of the electric field distribution in the reaction chamber finer by dispersing the microwave-shadow-causing beams, and intensifies the electric field in each slit opening 6. Consequently, uniform plasma can be produced by diffusion at positions close to the beams.

Figure 11A:
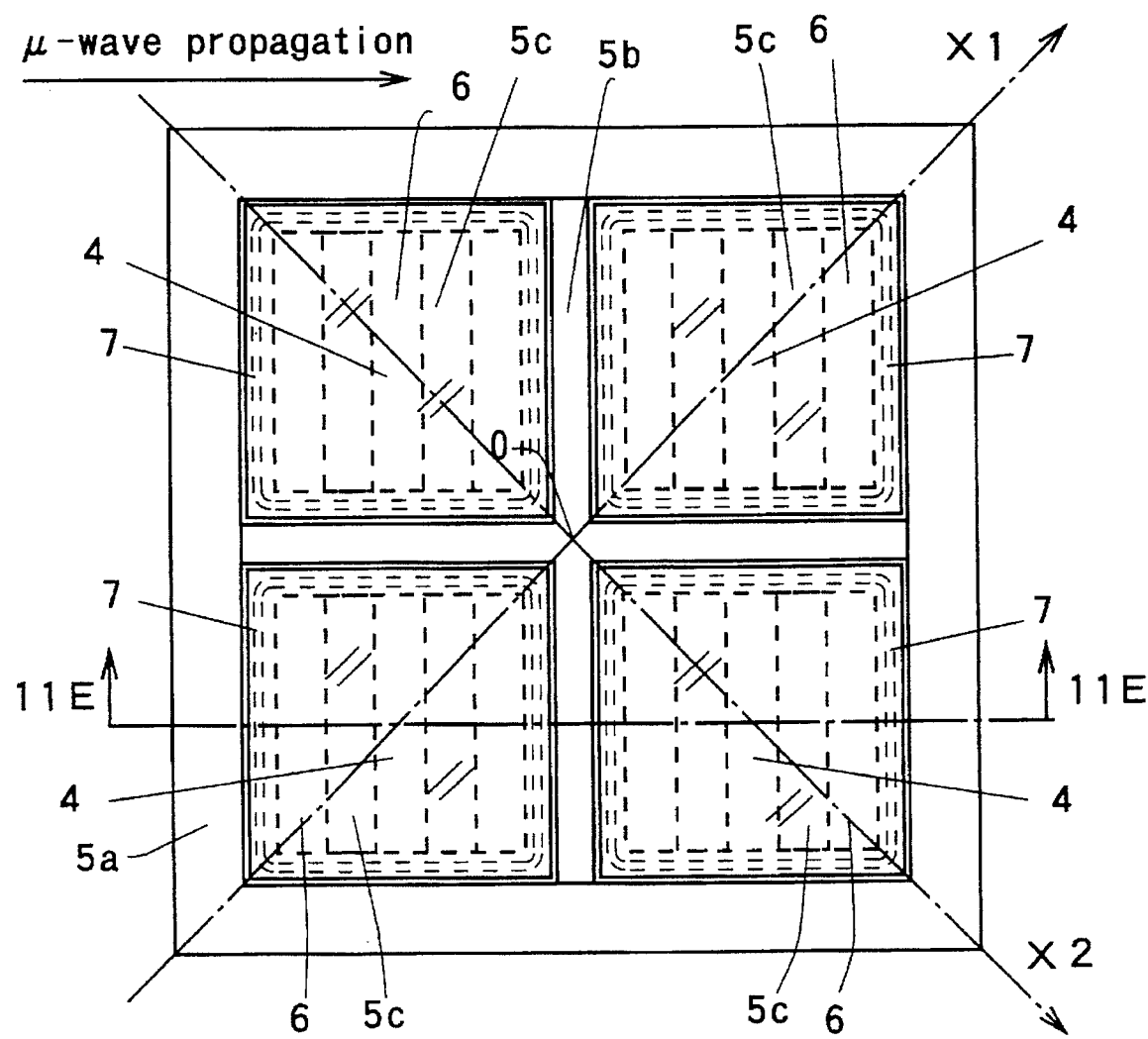
FIG. 11A is a schematic plan view of the window supporting member shown in FIG. 10A.
Figure 11B:
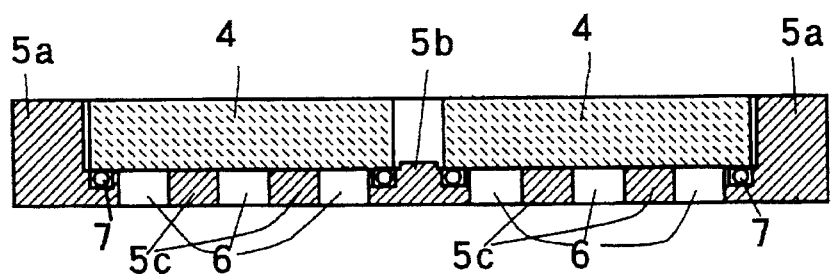
FIG. 11B is a longitudinal cross-sectional diagram taken along the line E—E of FIG. 11A.

FIG. 11A is a schematic plan view of the window supporting member shown in FIG. 10A, and FIG. 11B shows the longitudinal cross section along the line E—E of FIG. 11A. The window supporting member 5 consists of a square outer frame 5a which matches in shape with the top of the wall of the reaction chamber 1, central crossing beams 5b which divide the inner area of the frame into four equal areas, and beams 5c which form the slit openings 6. Each of the four areas divided by the crossing beams 5b is further divided into three slit openings 6, and a total of 12 slit openings 6 are formed in the window supporting member 5.

For the evaluation of the uniformity of plasma, the ion current density distribution was measured. The dimensions and materials of the apparatus are as follows. The plasma generation area (area of the microwave lead-in opening 3) is 600-by-600 mm. The window supporting member 5 has a beam width of 100 mm for the crossing beams 5b and a beam width of 50 mm for the beams 5c, and has 12 slit openings 6 each dimensioned by 250-by-50 mm. Each microwave window 4 has an area of 300-by-300 mm and a thickness of 20 mm, and the material is quartz. The dielectric sheet 21 has its flat section dimensioned by 800-by-600 mm and 20 mm in thickness, and the material is Teflon.

The conditions of plasma generation and measurement of ion current density distribution are as follows. Argon gas of a total amount of 1 slm was supplied into the reaction chamber 1 from the eight gas inlets 12 of the walls to establish a pressure of 10 mTorr. The microwave of 1 kW (frequency: 2.45 GHz; continuous wave) was supplied to generate plasma.

The ion current density was measured at several points aligning on the lines X1 and X2 (shown in FIG. 11A) at a distance of 60 mm from the window supporting member. For the comparison, the same measurement was conducted with the setup of window supporting member 5 without the beams 5c and having only four openings each dimensioned by 250-by-250 mm.

Figure 12A:
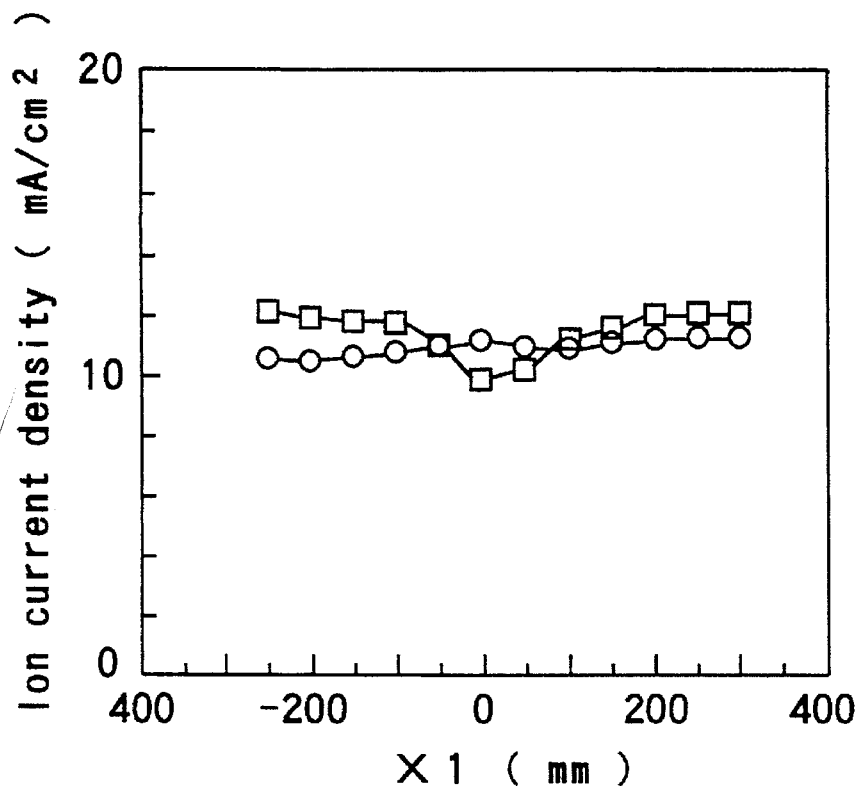
FIG. 12A is a graph showing the ion current density distribution in the X1 direction for the plasma processing apparatus of the fourth embodiment.
Figure 12B:
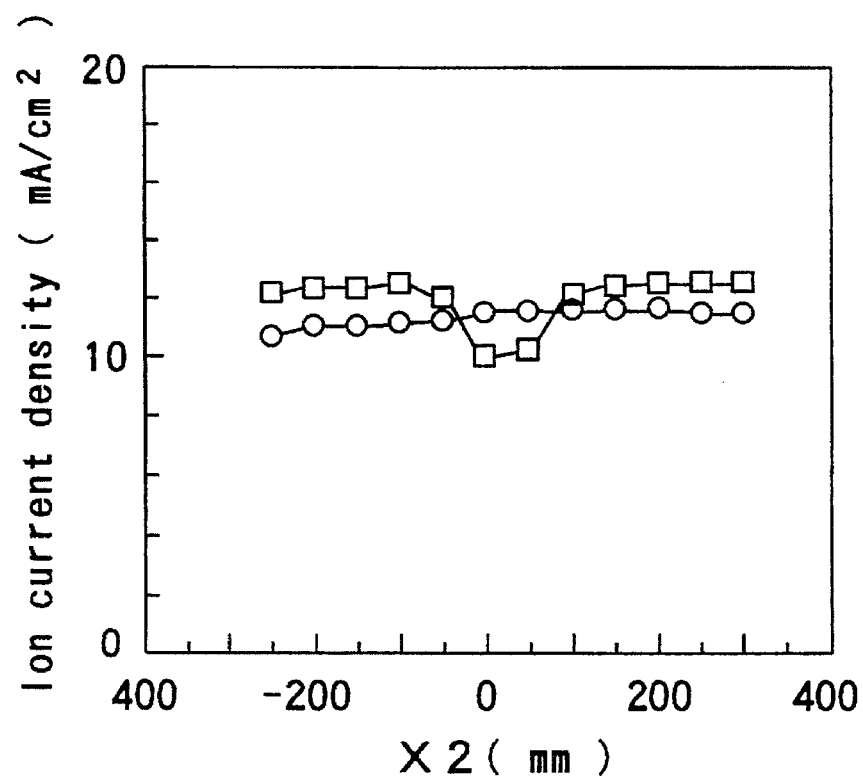
FIG. 12B is a graph showing the ion current density distribution in the X2 direction for this plasma processing apparatus.

FIGS. 12A and 12B show the ion current density distribution along the X1 and X2 directions, respectively, in which plotted by mark ○ is the result with the beams 5c and plotted by mark □ is the result without the beams 5c. The result of the setup for comparison (plots □) reveals that the ion current density is low behind the central portion of the beams 5b. In contrast, the inventive structure (plots ○) lowers the ion current density at the openings 6 and raises the ion current density at the central portion of the beams 5b, thereby averaging the ion current density as a whole.

In the case of the apparatus having a dielectric sheet, the ion current density decreased sharply when the shorter side of the slit opening 6 was reduced below 20 mm. Since the 2.45-GHz microwave has a wavelength in free space of 122.45 mm, it is desirable to set the shorter side of the slit opening 6 to be 1/6 or more of the microwave wavelength in order to generate plasma efficiently. In addition, by setting the length of shorter side of slit opening smaller than or equal to the microwave wavelength and arranging the slit openings at a spacing smaller than or equal to the microwave wavelength thereby to divide the shadow-causing beam structure, the uniformity of plasma can be improved.

As described above, it was confirmed that plasma can be generated uniformly even in the case of supporting the microwave window with beams and the fear of breakage of the window can be alleviated by this supporting structure. Accordingly, the plasma processing apparatus of this invention is capable of processing large semiconductor substrates and glass substrates for LCD panels stably and uniformly without the fear of breakage of the microwave window.

Although in any of the foregoing embodiments except for the fourth embodiment, four openings 6 are formed between the outer frame 5a and beams 5b in a 2-by-2 configuration in the microwave propagation direction and dielectric sheet transverse direction, four openings may be formed in a 4-by-1 configuration and a 1-by-4 configuration in the microwave propagation direction and dielectric sheet transverse direction. The number of openings of the window supporting member 5 is arbitrary (more than one), and it is determined together with their configuration based on the plasma generation area, the uniformity of plasma required, and the strength of the microwave window 4.

Although in the foregoing embodiments, the microwave windows 4 is divided into four in correspondence to the openings 6 of the supporting member 5, it may be divided into two, or it may be a single plate which matches in shape with the outer frame 5a. Obviously, the smaller the area of the microwave windows 4, the less is the fear of breakage.

Although in any of the foregoing embodiments, the window supporting member 5 having the beams is a component part separate from the reaction chamber 1, both parts may be formed as a unitary member obviously.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A plasma processing apparatus comprising:

means of supplying a microwave;

a reaction chamber having a microwave lead-in opening, with a sample stage being disposed inside said chamber;

a microwave window for introducing the microwave provided by said microwave supply means into said reaction chamber through said microwave lead-in opening; and a supporting member having beams for supporting said microwave window.

2. A plasma processing apparatus according to claim 1, wherein said microwave window is divided in correspondence to areas of said supporting member divided by said beams.

3. A plasma processing apparatus according to claim 1 further including means of supplying gas from said beams into said reaction chamber.

4. A plasma processing apparatus comprising:

means of supplying a microwave;

a dielectric sheet which the microwave provided by said microwave supply means is directed into and propagates in;

a reaction chamber having a microwave lead-in opening, with a sample stage being disposed inside said chamber;

a microwave window disposed to confront said dielectric sheet for introducing the microwave propagating in said dielectric sheet into said reaction chamber through said microwave lead-in opening; and a supporting member having beams for supporting said microwave window.

5. A plasma processing apparatus according to claim 4, wherein said microwave window is divided in correspondence to areas of said supporting member divided by said beams.

6. A plasma processing apparatus according to claim 4 further including means of supplying gas from said beams into said reaction chamber.

7. A plasma processing apparatus according to claim 4, wherein said beams of supporting member are arranged such that slit-shaped openings formed by said beams of said supporting member have a length of shorter side greater than or equal to 1/6 of the wavelength of the microwave and smaller than or equal to the microwave wavelength and align at a spacing smaller than or equal to the microwave wavelength.

* * * * *